United States Patent
Lian et al.

(10) Patent No.: US 6,327,145 B1
(45) Date of Patent: Dec. 4, 2001

(54) HEAT SINK WITH INTEGRATED FLUID CIRCULATION PUMP

(75) Inventors: Bin Lian; Terrance J. Dishongh, both of Hillsboro; Damion T. Searls; Prateek J. Dujari, both of Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/654,215

(22) Filed: Sep. 1, 2000

(51) Int. Cl.[7] .................................................. H05K 7/20
(52) U.S. Cl. ................ 361/697; 62/259.2; 165/80.4; 174/15.1; 257/714; 257/722; 361/699
(58) Field of Search ......................... 62/259.2; 165/80.2, 165/80.3, 80.4, 185; 174/15.1, 16.1; 257/714–715, 722; 361/689, 697–701

(56) References Cited

U.S. PATENT DOCUMENTS

| | | | |
|---|---|---|---|
| 5,091,824 | * | 2/1992 | Dzwonczyk ........................ 361/699 |
| 5,646,824 | * | 7/1997 | Ohashi et al. ...................... 361/699 |
| 5,731,954 | * | 3/1998 | Cheon ................................. 361/699 |
| 6,152,213 | * | 11/2000 | Suzuki ................................ 361/699 |

OTHER PUBLICATIONS

Josh Norem, "Axis Terra AXA, This thunderbird box rocks", Maximum PC, Oct. 2000, pp. 68–69, vol. 5, No. 10, USA.

* cited by examiner

Primary Examiner—Gregory Thompson
(74) Attorney, Agent, or Firm—Robert G. Winkle

(57) ABSTRACT

A heat dissipation device including a base portion having a plurality of projections extending radially therefrom. A cooling fluid and circulation tubes are used to increase the efficiency of the heat dissipation device by pumping the heat (via the cooling fluid) from the hot base portion to the tips of the projections. The cooling fluid is circulated by a small centrifugal pump, which is driven by a fan attached to the heat dissipation device used for creating forced air-cooling.

23 Claims, 5 Drawing Sheets

HEAT SINK WITH INTEGRATED FLUID CIRCULATION PUMP

BACKGROUND OF THE INVENTION

1. Field of the Invention

The present invention relates to apparatus and methods for removal of heat from electronic devices. In particular, the present invention relates to a fluid circulation pump in conjunction with a heat sink for the removal of heat from a microelectronic die.

2. State of the Art

Higher performance, lower cost, increased miniaturization of integrated circuit components, and greater packaging density of integrated circuits are ongoing goals of the computer industry. As these goals are achieved, microelectronic dice become smaller. Accordingly, the density of power consumption of the integrated circuit components in the microelectronic die has increased, which, in turn, increases the average junction temperature of the microelectronic die. If the temperature of the microelectronic die becomes too high, the integrated circuits of the microelectronic die may be damaged or destroyed.

Various apparatus and techniques have been used and are presently being used for removing heat from microelectronic dice. One such heat dissipation technique involves the attachment of a high surface area heat sink to a microelectronic die. FIG. 5 illustrates an assembly 200 comprising a microelectronic die 202 (illustrated as a flip chip) physically and electrically attached to a substrate carrier 204 by a plurality of solder balls 206. A heat sink 208 is attached to a back surface 212 of the microelectronic die 202 by a thermally conductive adhesive 214. The heat sink 208 is usually constructed from a thermally conductive material, such as copper, copper alloys, aluminum, aluminum alloys, and the like. The heat generated by the microelectronic die 202 is drawn into the heat sink 208 (following the path of least thermal resistance) by conductive heat transfer.

High surface area heat sinks 208 are generally used because the rate at which heat is dissipated from a heat sink is substantially proportional to the surface area of the heat sink. The high surface area heat sink 208 usually includes a plurality of projections 216 extending substantially perpendicularly from the microelectronic die 202. It is, of course, understood that the projections 216 may include, but are not limited to, elongate planar fin-like structures and columnar/pillar structures. The high surface area of the projections 216 allows heat to be convectively dissipated from the projections 216 into the air surrounding the high surface area heat sink 208. A fan 218 may be incorporated into the assembly 200 to enhance the convective heat dissipation.

Although high surface area heat sinks are utilized in a variety of microelectronic applications, they have not been completely successful in removing heat from microelectronic dice that generate substantial amounts of heat. Therefore, it would be advantageous to develop apparatus and techniques to effectively remove heat from microelectronic dice.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Although the figures illustrate various views of the present invention, these figures are not meant to portray microelectronic assemblies in precise detail. Rather, these figures illustrate microelectronic assemblies in a manner to more clearly convey the concepts of the present invention. Additionally, elements common between the figures retain the same numeric designation.

Figure 1:
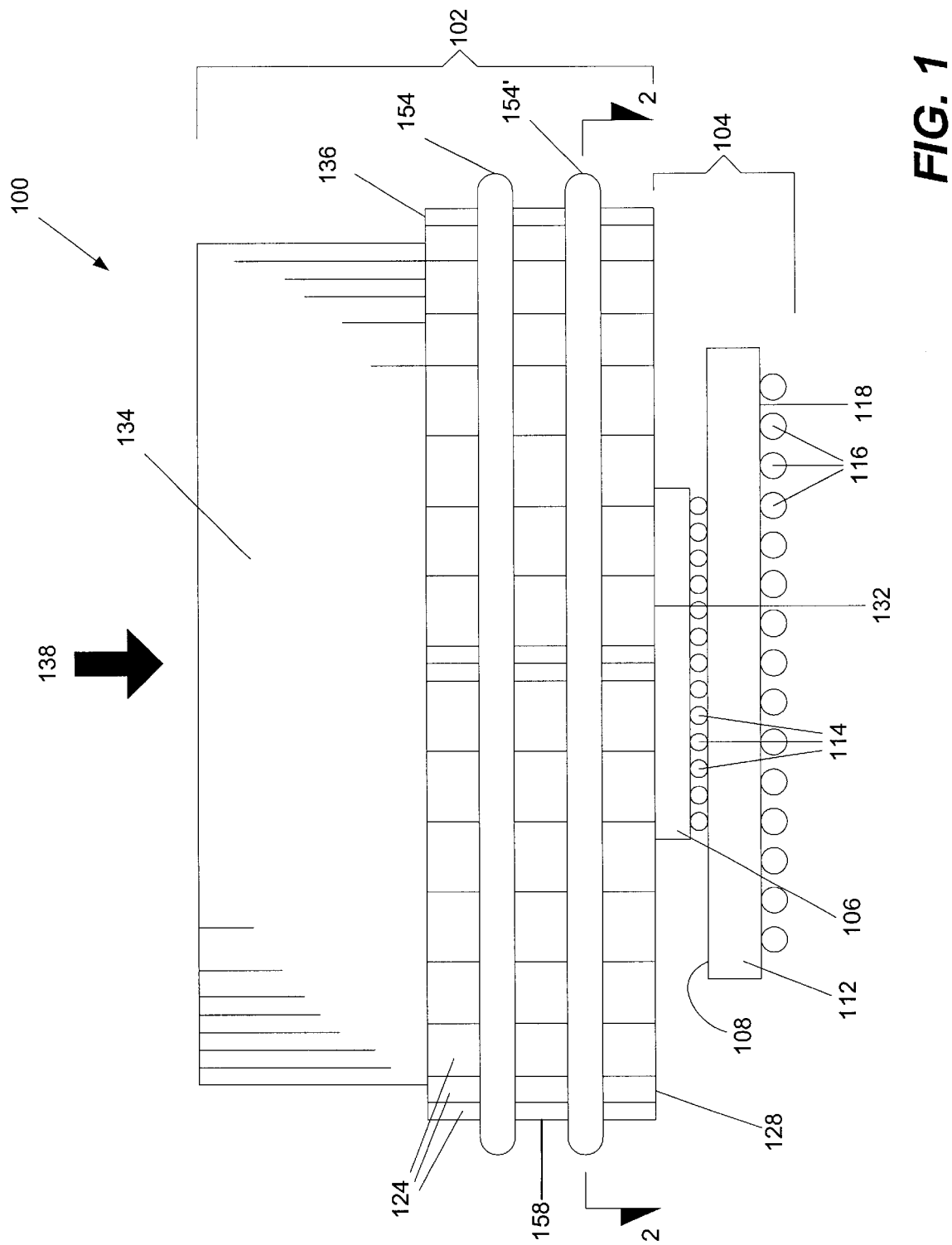
FIG. 1 is a side plan view of the heat dissipation device attached to a microelectronic die, according to the present invention.

FIG. 1 illustrates a microelectronic assembly 100 of the present invention comprising a heat dissipation device 102 attached to a microelectronic die assembly 104. The microelectronic die assembly 104 comprises a microelectronic die (illustrated as a flip-chip 106) attached to and in electrical contact with an top surface 108 of an interposer substrate 112 by a plurality of small solder balls 114. Traces (not shown) extend through the interposer substrate 112 to connect with external contacts 116 (shown as solder balls) formed on a bottom surface 118 of the interposer substrate 112. The microelectronic die assembly 104 is exemplary of organic land grid array (OLGA) assemblies.

Figure 2:
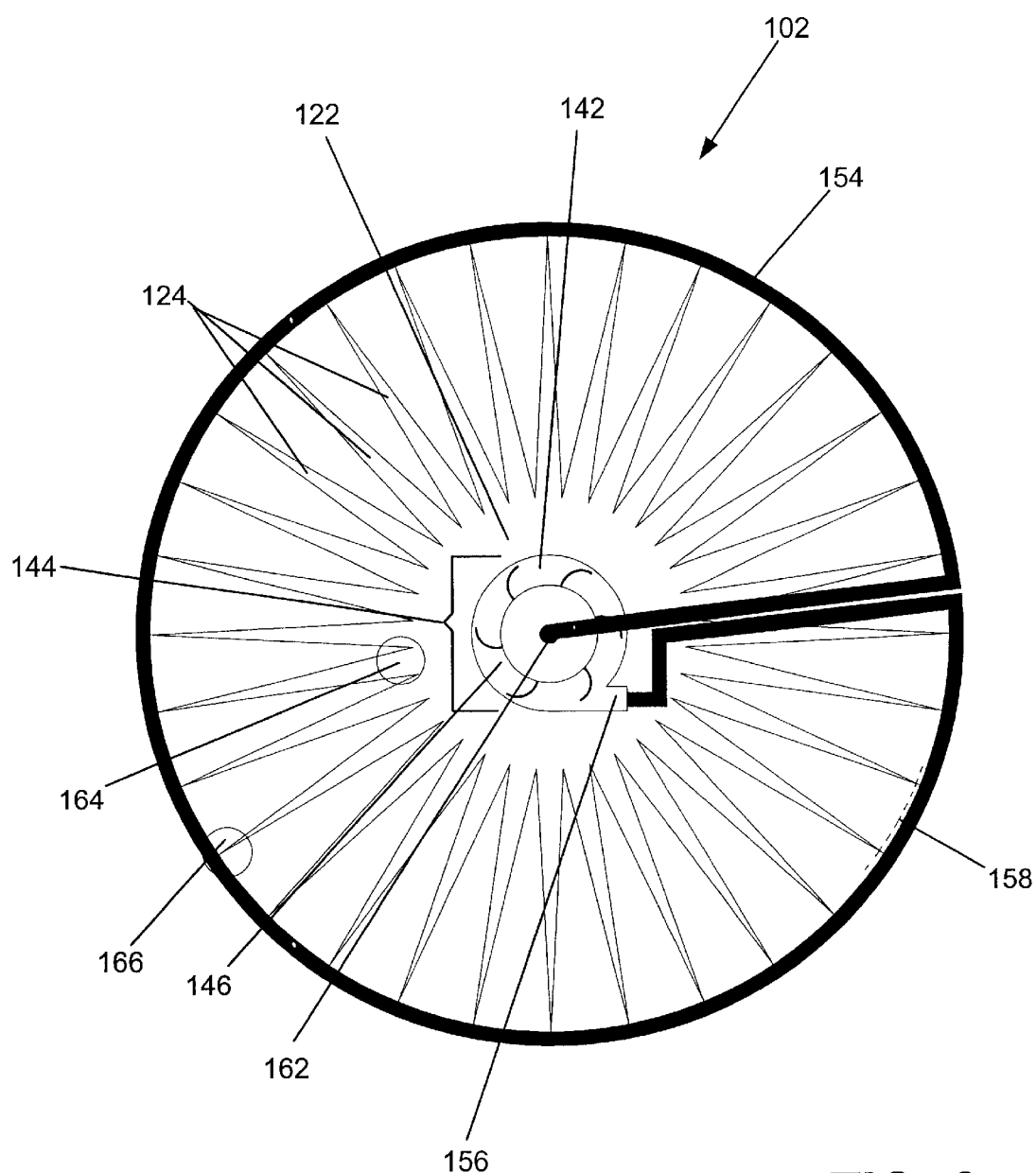
FIG. 2 is a top cross-sectional view of the heat dissipation device along line 2—2 of FIG. 1, according to the present invention.

As shown in FIG. 2, the heat dissipation device 102 comprises a base portion 122, which is preferably substantially cylindrical, and a plurality of projections or fins 124 extending from the base portion 122. The heat dissipation device 102 is preferably fabricated from a thermally conductive material, such as, but not limited to, copper, copper alloys, aluminum, aluminum alloys, and the like. The projections 124 are generally molded during the formation (e.g., forging, extrusion, etc.) of the heat dissipation device 102 or machined therein after formation (e.g., skiving). It is, of course, understood that although the projections 124 are shown as fins having a triangular cross-section, the projections may include, but are not limited to, elongate planar fin-like structures (i.e., rectangular cross-section) and other such configurations.

Preferably, the projections 124 extend radially in a substantially planar orientation with a centerline 126 (see FIG. 3) of the base portion 122. As shown in FIG. 1, a lower surface 128 of the heat dissipation device 102 is attached to a back surface 132 of the flip-chip 106, preferably by a thermally conductive adhesive (not shown). Although the heat dissipation device 102 is illustrated as being attached to the flip-chip 106, the invention is, of course, not so limited. The heat dissipation device 102 may be attached to any surface in which heat removal is desired.

Figure 3:
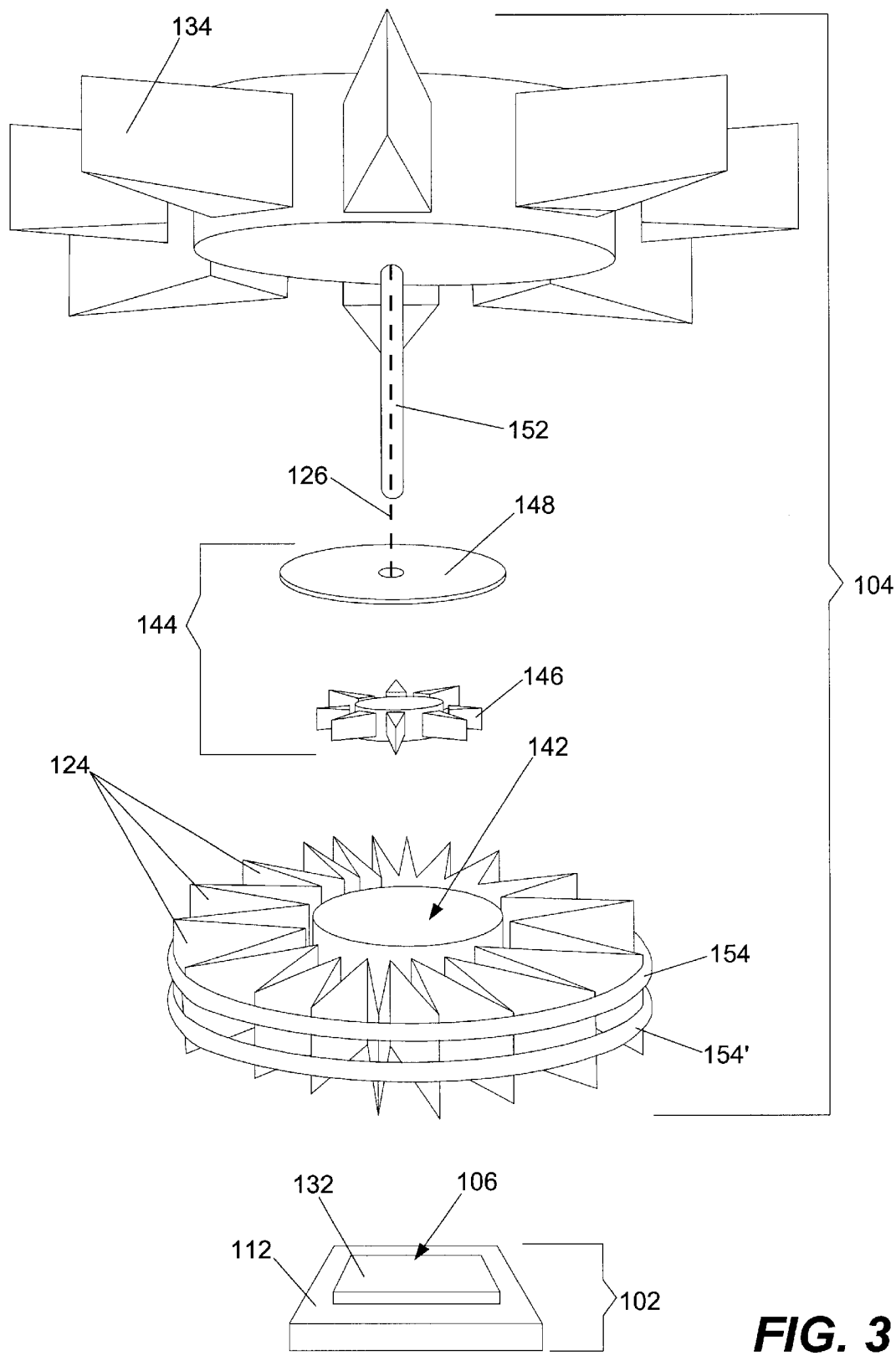
FIG. 3 is an oblique, exploded view of the heat dissipation device as shown in FIG. 1, according to the present invention.

As shown in FIGS. 1 and 3, a fan 134 is positioned adjacent to an upper surface 136 of the heat dissipation device 102. Air is blown in direction 138 into space between the projections 124. The fan 134 is illustrated as a fan blade assembly within a housing in FIG. 1 and as a fan blade assembly without a housing in FIG. 3.

As shown in FIGS. 2 and 3, the heat dissipation device 102 includes a chamber 142 in the base portion 122 thereof. A pumping apparatus 144 is housed within the chamber 142. The pumping apparatus 144 is shown as a centrifugal pump having an impeller 146 set within the chamber 142 and sealed with a cap 148 (see FIG. 3). An axle 152 attaches to the fan 134 and extends through the cap 148 to contact the impeller 146. The rotation of the fan 134 also drives the impeller 146 of the pumping apparatus 144. The pumping apparatus 144 also includes at least one circulation tube 154 (illustrated embodiment shown with two circulation tubes 154 and 154' in FIGS. 1 and 3). The circulation tubes 154 and 154' are preferably fabricated from a thermally conductive material, such as, but not limited to, copper, copper alloys, aluminum, aluminum alloys, and the like. As shown in FIG. 2, the circulation tube 154 extends from an exit port 156 of the pumping apparatus 144 to an outer periphery 158 of the projections 124 (the outer periphery 158 is emphasized with a dashed line in FIG. 2). The circulation tube 154 follows the outer periphery 158 around the heat dissipation device 102 and returns to an inlet port 162 of the pumping apparatus 144. The circulation tube 154 preferably makes contact with each of the projections 124.

Figure 4:
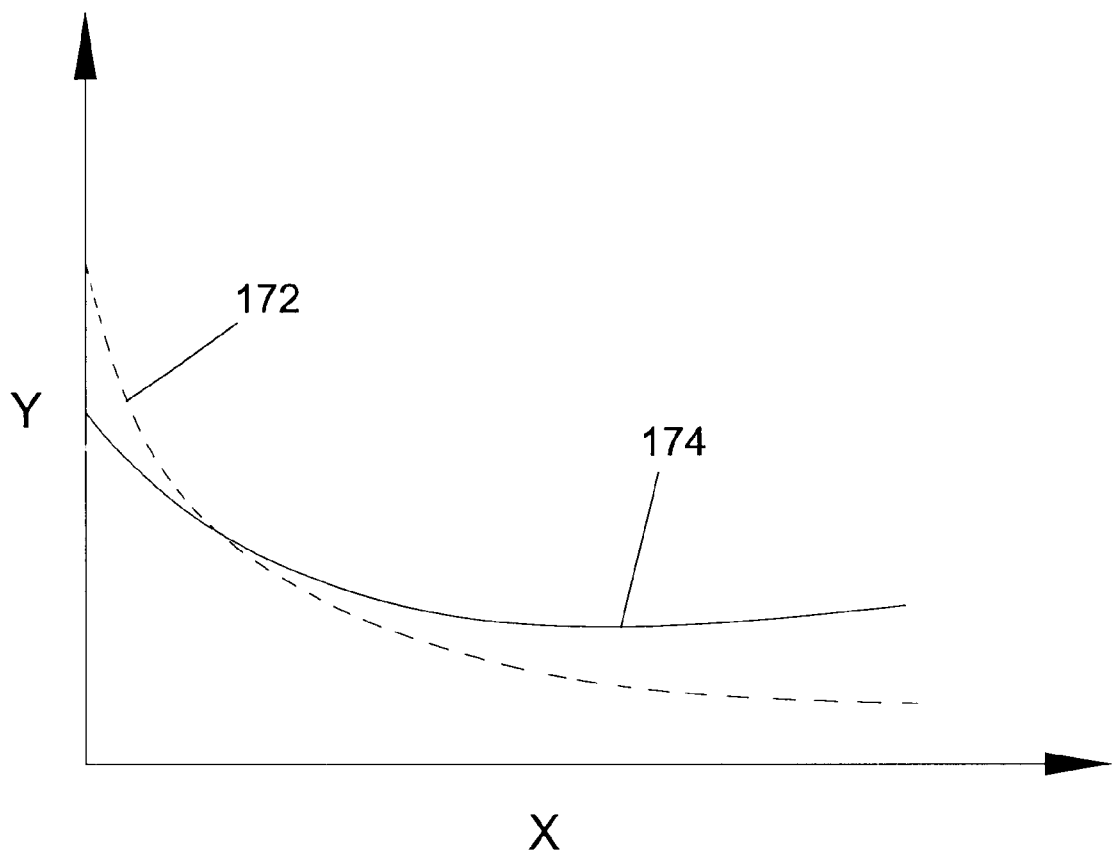
FIG. 4 is a graph of potential thermal dissipation improvement.
Figure 5:
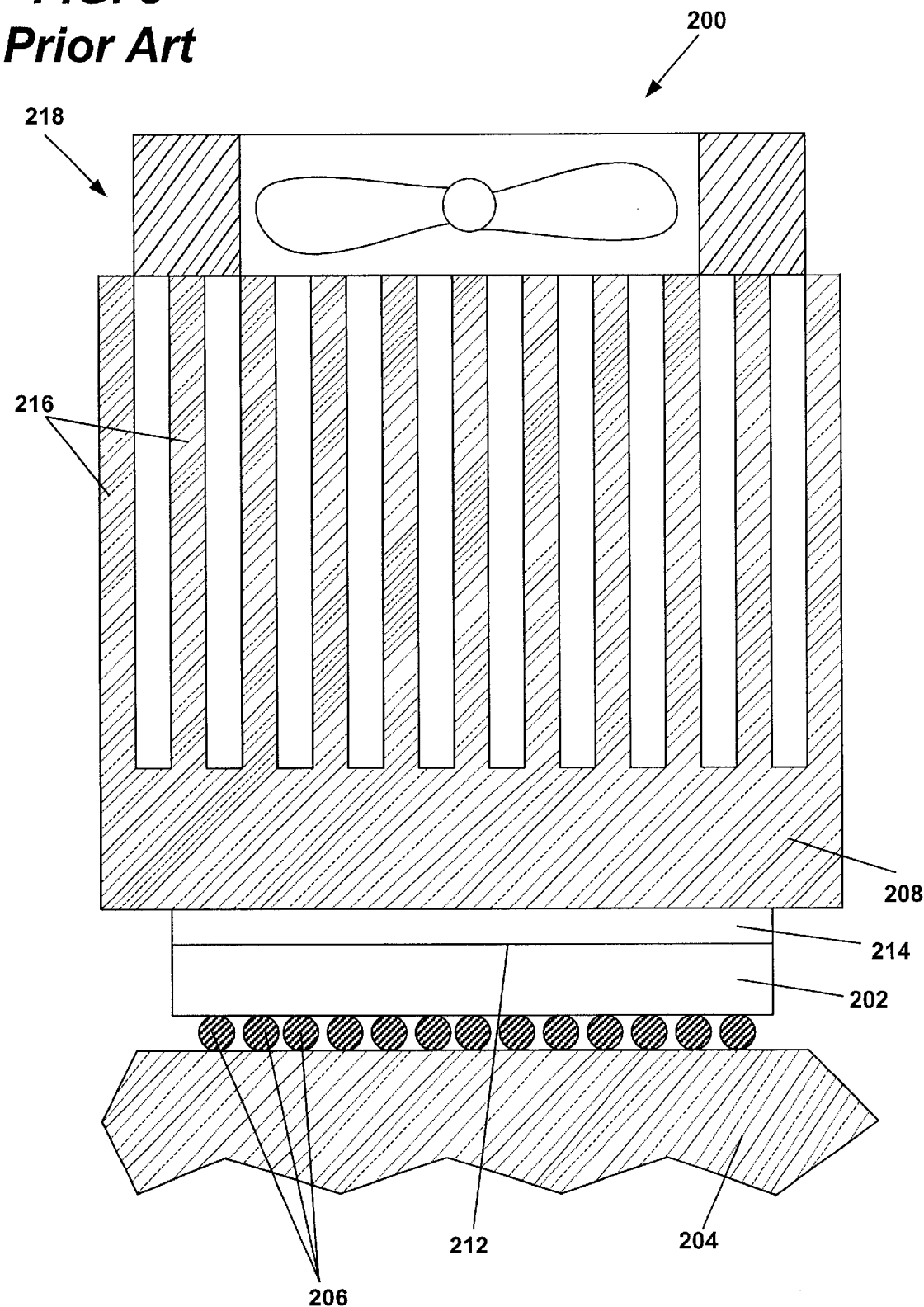
FIG. 5 is a side cross-sectional view of a heat dissipation device attached to a microelectronic die, as known in the art.

A cooling fluid, such as water, fluorocarbon liquid, freon, silicone fluid, and the like (not shown), is circulated through the circulation tubes 154, 154' by the pumping action of impeller 146 when the fan 134 is in operation. The hottest portion of the heat dissipation device 102 is the base portion 122, because it makes closest contact with the heat source (i.e., flip-chip 106). It is well known that the temperature within the heat dissipation device 102 decreases as the heat moves further from the heat source, i.e., along the projections 124. This is demonstrated in FIG. 4 is a graph, wherein a length of the projection 124 is the X-axis and temperature is the Y-axis. The temperature at the base 164 (see FIG. 2) of the projections 124 is on the left-hand side of the X-axis and the temperature at the tips 166 (see FIG. 2) of the projections 124 is on the right-hand side of the X-axis. Curve 172 is an illustration of the temperature gradient of the heat dissipation device 102 without the use of the cooling fluid and circulation tubes 154, 154'. It is, of course, understood that the graph in FIG. 4 is merely exemplary and is not meant to portray a specific temperature range or a specific projection length.

When the cooling fluid and the circulation tubes 154, 154' of the present invention are employed, a cooling fluid is heated as it is pumped through the chamber 142 (i.e., the hottest portion of the heat dissipation device 102). The cooling fluid is then pumped to the heat dissipation device outer periphery 158, as previously described. As the cooling fluid travels the heat dissipation device outer periphery 158, heat is dissipated from the cooling fluid convectively from the circulation tubes 154, 154'. The heat is also dissipated conductively into the projections 124 where the circulation tubes 154, 154' make contact therewith. This is demonstrated in FIG. 4 as curve 174. The temperature at the base 164 (see FIG. 2) of the projections 124 (left-hand side of the X-axis in FIG. 4) is lower than curve 172 because heat is being extracted from the base portion 122 by the cooling fluid. The temperature at the tips 164 (see FIG. 2) of the projections 124 (right-hand side of the X-axis in FIG. 4) is higher that curve 172 because the projection tips 166 are being heated by the cooling fluid, as previously described. Thus, the overall heat dissipated will be greater for the embodiment of the heat dissipation device 102 of the present invention.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A heat dissipation device, comprising:
   a base portion having a chamber defined therein;
   a plurality of projections extending from said base portion;
   a pumping apparatus disposed in said base portion chamber; and
   at least one circulation tube operationally engaging said pumping apparatus and extending from said base portion chamber to contact at least one of said plurality of projections.

2. The heat dissipation device of claim 1, wherein said at least one circulation tube extends around a periphery of said plurality of projections.

3. The heat dissipation device of claim 1, wherein said base portion is substantially cylindrical and said plurality of projections extend substantially radially and in a substantially planar orientation with a centerline of said base portion.

4. The heat dissipation device of claim 1, further including a fan positioned adjacent an upper surface of said base portion.

5. The heat dissipation device of claim 4, wherein said fan and said pumping apparatus are operationally engaged.

6. The heat dissipation device of claim 5, wherein said fan and said pumping apparatus are operationally engaged by an axle extending therebetween.

7. The heat dissipation device of claim 1, further including a cooling fluid disposed in said at least one circulation tube and said pumping apparatus.

8. A heat dissipation device, comprising:
   a base portion having a chamber defined therein;
   a plurality of projections extending from said base portion;
   a pumping apparatus disposed in said base portion chamber;
   at least one circulation tube operationally engaging said pumping apparatus and extending from said base portion chamber to contact at least one of said plurality of projections;
   a fan positioned adjacent to an upper surface of said base portion; and
   an axle extending between said fan and said pumping apparatus such that the operation of said fan drives said pumping apparatus.

9. The microelectronic assembly of claim 8, wherein said at least one circulation tube extends around a periphery of said plurality of projections.

10. The microelectronic assembly of claim 8, wherein said base portion is substantially cylindrical and said plurality of projections extend substantially radially and in a substantially planar orientation with a centerline of said base portion.

11. The heat dissipation device of claim 8, further including a cooling fluid disposed in said at least one circulation tube and said pumping apparatus.

12. A microelectronic assembly, comprising:
    a microelectronic die; and
    a heat dissipation device, comprising:
        a base portion having a chamber defined therein;
        a plurality of projections extending from said base portion;

a pumping apparatus disposed in said base portion chamber; and at least one circulation tube operationally engaging said pumping apparatus and extending from said base portion chamber to contact at least one of said plurality of projections.

13. The microelectronic assembly of claim 12, wherein said at least one circulation tube extends around a periphery of said plurality of projections.

14. The microelectronic assembly of claim 12, wherein said base portion is substantially cylindrical and said plurality of projections extend substantially radially and in a substantially planar orientation with a centerline of said base portion.

15. The microelectronic assembly of claim 12, further including a fan positioned adjacent an upper surface of said base portion.

16. The microelectronic assembly of claim 15, wherein said fan and said pumping apparatus are operationally engaged.

17. The microelectronic assembly of claim 16, wherein said fan and said pumping apparatus are operationally engaged by an axle extending therebetween.

18. The heat dissipation device of claim 12, further including a cooling fluid disposed in said at least one circulation tube and said pumping apparatus.

19. A method of cooling a heat source, comprising:

providing a heat dissipation device having a base portion with a chamber defined therein, wherein a lower surface of said heat dissipation device is dispose proximate said heat source;

forming a plurality of projections to extend from said base portion;

positioning at least one circulation tube to extend from said base portion chamber to contact at least one of said plurality of projections;

disposing a cooling fluid within said at least one circulation tube and said base portion chamber; and pumping said cooling fluid through said at least one circulation tube and said base portion chamber with a pumping apparatus disposed within said base portion chamber.

20. The method of claim 19, wherein positioning said at least one circulation tube includes positioning said at least one circulation tube to extend around a periphery of said plurality of projections.

21. The method of claim 19, wherein forming said plurality of projections includes forming said plurality of projections to extend substantially radially to said base portion.

22. The method of claim 19, further including flowing air between said plurality of projections with a fan positioned adjacent an upper surface of said base portion.

23. The method of claim 22, further including providing an axle extending between said fan and said pumping apparatus, such that the operation of said fan drives said pumping apparatus.

* * * * *